US006720808B1

(12) United States Patent
Chan

(10) Patent No.: US 6,720,808 B1
(45) Date of Patent: Apr. 13, 2004

(54) METHOD AND SYSTEM FOR A CMOS POWER UP CIRCUIT WITH ADJUSTABLE THRESHOLD

(75) Inventor: Wai Chan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/293,136

(22) Filed: Nov. 12, 2002

(51) Int. Cl.[7] ...................... H03K 17/22; H03K 17/687
(52) U.S. Cl. ........................................ 327/143; 327/198
(58) Field of Search ................................. 327/143, 198

(56) References Cited

U.S. PATENT DOCUMENTS

| 5,703,510 A | * | 12/1997 | Iketani et al. | ................ | 327/143 |
| 5,734,280 A | * | 3/1998 | Sato | ............................ | 327/143 |
| 5,767,710 A | * | 6/1998 | Cho | ............................. | 327/143 |
| 6,320,809 B1 | * | 11/2001 | Raad | ........................... | 365/226 |

* cited by examiner

Primary Examiner—Timothy P. Callahan
Assistant Examiner—Terry L. Englund

(57) ABSTRACT

A CMOS power up circuit for producing a power up signal for an integrated circuit device includes a plurality of transistor chains coupled to first and second select lines. The first and second select lines are configured to enable a selected one of the transistor chains. A VCC input is coupled to the transistor chains. An output latch is included in the power up circuit for generating a power up signal. The output latch is coupled to the transistor chains and to the VCC input and is configured to keep the power up signal deasserted until a voltage from the selected one transistor chain rises past a switch on threshold as VCC rises. When VCC rises past the switch on threshold, the output latch asserts the power up signal and maintains the power up signal asserted even if the voltage level of the VCC input temporarily droops below the switch on threshold.

18 Claims, 3 Drawing Sheets

METHOD AND SYSTEM FOR A CMOS POWER UP CIRCUIT WITH ADJUSTABLE THRESHOLD

TECHNICAL FIELD

The present invention relates to the field of low-power integrated circuits. More particularly, the present invention relates to a CMOS power up circuit that is resistant to drooping on the power supply.

BACKGROUND ART

Minimizing any static current is critical in extending operating time in portable or battery power device. Accordingly, the power up circuit, which operates only briefly as power is first applied to the device, should not consume static current after the power up signal has been generated. In addition, it is advantageous to have the ability to tune the threshold of the power up event for different applications. Prior art power up circuits are disclosed in U.S. Pat. Nos. 5,565,807 and 5,617,048. However, these circuits require bipolar/BiCMOS processes for their fabrication. These prior art circuits are configured to use pn diodes as well as Schottky transistors, which are not generally available in a CMOS fabrication process. Additionally, these prior art circuits incur a static current drain. Moreover, if the power supply input of the device droops below a certain level, the power up signal will be reset, causing the device to reset, turn off, or otherwise behave erratically.

Thus, what is required is a power up circuit which is capable of maintaining a valid power up signal, or power up indication, even when the power supply voltage droops below a switch on threshold, in comparison to the prior art. What is required is a power up circuit that maintains a valid power up signal and that can be readily fabricated using modern CMOS VLSI fabrication techniques. In addition, what is required is a solution that can implement power up threshold tuning for the needs of different devices. The present invention provides a novel solution to the above requirements.

SUMMARY OF THE INVENTION

Embodiments of the present invention provide a power up circuit which is capable of maintaining a valid power up signal, or power up indication, even when the power supply voltage droops below a switch on threshold. Embodiments of the present invention implement a power up circuit that maintains a valid power up signal and that can be readily fabricated using modern CMOS VLSI fabrication techniques. In addition, embodiments of the present invention implement power up threshold tuning for the needs of different devices.

In one embodiment, the present invention is implemented as a CMOS power up circuit for producing a power up signal for an integrated circuit device. The CMOS power up circuit includes a plurality of transistor chains coupled to first and second select lines. The first and second select lines are configured to enable a selected one of the transistor chains. A VCC input is coupled to the transistor chains. An output latch is included in the power up circuit for generating a power up signal. The output latch is coupled to the transistor chains and to the VCC input and is configured to keep the power up signal deasserted until a voltage from the selected one transistor chain rises past a switch on threshold as VCC rises. When VCC rises past the switch on threshold, the output latch asserts the power up signal and maintains the power up signal asserted at the VCC level, even if the VCC voltage level droops below the switch on threshold.

In one embodiment, each of the plurality of transistor chains is configured to provide a respective switch on threshold by providing a respective resistance when enabled by the first and second select lines. The first and second select lines are configured to implement an adjustable switch on threshold as the first and second select lines selectively enable one of the transistor chains.

In one embodiment, the output latch is configured to use feedback to keep the power up signal deasserted and to maintain the power up signal asserted. The output latch can comprise a first inverter and second inverter coupled to implement the feedback.

BRIEF DESCRIPTION OF THE DRAWINGS

The present invention is illustrated by way of example and not by way of limitation, in the Figures of the accompanying drawings and in which like reference numerals refer to similar elements and in which.

DETAILED DESCRIPTION OF THE INVENTION

Reference will now be made in detail to the embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1:
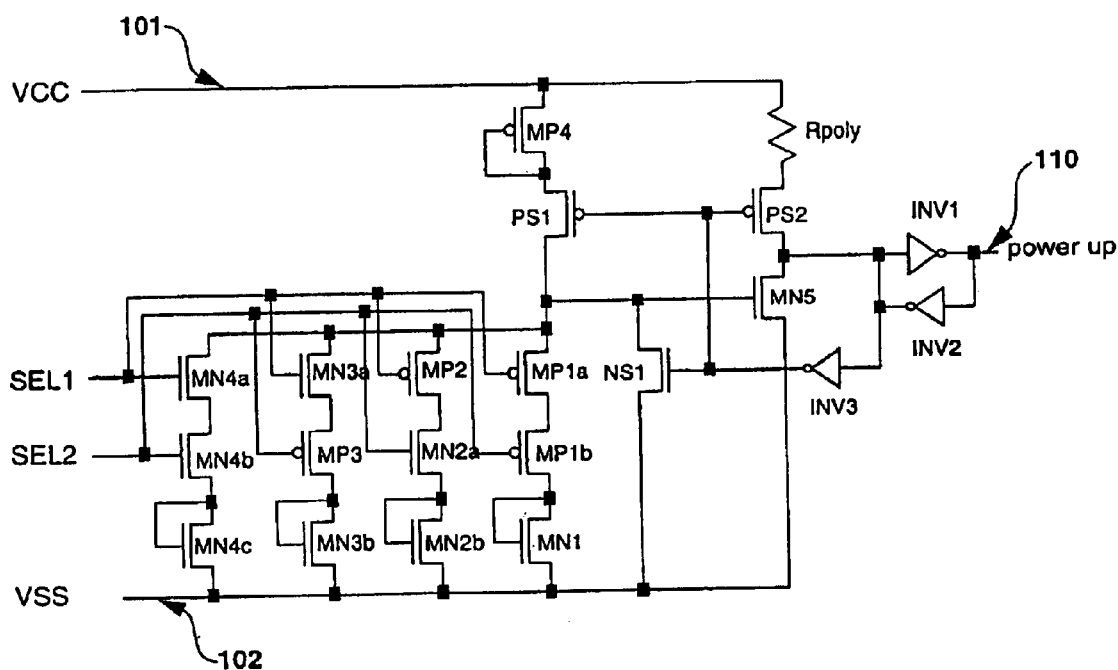
FIG. 1 shows a power up circuit in accordance with one embodiment of the present invention.

FIG. 1 shows a power up circuit 100 in accordance with one embodiment of the present invention. As depicted in FIG. 1, the power up circuit 100 is coupled to receive a power supply voltage, VCC, via a VCC input 101 and generate therefrom a power up signal 110 for use by, for example, other circuits of an integrated circuit device (not shown).

In the present embodiment, the power up circuit 100 functions by monitoring VCC as the voltage level of VCC rises from ground to a powered up state, and generating the power up signal 110 when VCC reaches a reliable operating voltage level. As is well known, it is important to ensure the circuits of a given device reliably wake up from the off state.

As a device is turned on from an off state, the voltage level of VCC does not instantaneously rise to the proper operating level. The voltage level of VCC generally ramps up to the proper operating level over a period of time (e.g., in the order of microseconds to milliseconds), as the power supply energizes its circuits and begins to drive VCC. The power up signal 110 generated by the power up circuit 100 could be used to prevent the premature operation of circuit elements as they are energized by the rising VCC.

This power up signal can be used to ensure storage elements initialize to their proper configuration (e.g., logical one vs. logical zero) and that clock circuits do not begin generating clock signals until the power voltage level is sufficient to ensure their reliable operation. Generally, each of such circuit elements or circuit stages are coupled to receive the power up signal 110 and use the power up signal 110 to prevent their premature operation.

The operation of the power up circuit 100 is now generally described. In the present embodiment, the power up circuit 100 is implemented as a CMOS circuit fabricated using CMOS device manufacturing technology. The CMOS power up circuit 100 includes a plurality of transistor chains coupled to first and second select lines SELL and SEL2. As depicted in FIG. 1, transistors MN4*a*, MN4*b*, and MN4*c* comprise the first transistor chain, transistors MN3*a*, MP3, and MN3*b* comprise the second transistor chain, MP2, MN2*a*, and MN2*b* comprise the third transistor chain, and MP1*a*, MP1*b*, and MN1 comprise the fourth transistor chain. Thus, as depicted in FIG. 1, the transistor chains each comprise three transistors coupled in series. The first and second select lines SEL1 and SEL2 are configured to enable a selected one of the transistor chains. By selecting different transistor chains, the switch on threshold can be adjusted in accordance with the requirements of a given device or a given application. A VCC input 101 is coupled to the transistor chains and a ground, VSS 102, is coupled to transistor chains.

Referring still to the power up circuit 100 embodiment of FIG. 1, an output latch is included in the power up circuit 100 for generating a power up signal. In the present embodiment, the output latch comprises the inverters INV1 and INV2. The output latch is coupled to the transistor chains and to the VCC input 101, and is configured to keep the power up signal 110 deasserted until a voltage from the selected one transistor chain rises past a switch on threshold as VCC 101 rises. When VCC 101 rises past the switch on threshold, the output latch (e.g., the inverters INV1 and INV2) asserts the power up signal 110 and maintains the power up signal 110 asserted even if the VCC droops below the switch on threshold.

In the present embodiment, the transistors PS1 and PS2 function as switches for the current paths through MP4 and a resistor Rpoly, respectively, as shown. The transistor NS1 functions as a switch used to turn the transistor MN5 off once the proper power up voltage has been detected on VCC 101. As VCC 101 is rising, the power up signal is deasserted (e.g., low), transistors PS1 and PS2 will be on, and transistor NS1 will be off.

It should be noted that, in the present embodiment, the transistors MN1, MN2*b*, MN3*b*, and MN4*c* are long channel transistors that function as resistors. The gate-drain nodes of the transistors MN1, MN2*b*, MN3*b*, and MN4*c*, and hence the gate node of transistor MN5, through one of the 4 sets of transistors MP1*a* and MP1*b*, MP2 and MN2*a*, MN3*a* and MP3, MN4*a* and MN4*b*, will gradually rise with VCC 101.

The resistor Rpoly is a poly resistor whose value is chosen such that it is capable of keeping the input of the inverter INV1 high until the switch on threshold is reached. The transistor MN5 is sized such that as the gate level reaches the switch on threshold, it can sink the current through the resistor Rpoly and keep the input of the inverter INV1 low. At the switch on threshold, the power up signal 110 will be asserted indicating VCC 101 has risen sufficiently high (e.g., depending on the combinations of SEL1 and SEL2) for normal circuit operation. This in turn drives the output of the inverter INV2 low. The combination of the inverters INV1 and INV2 holds the state of the power up signal 110 once the VCC threshold (e.g., the switch on threshold) is reached.

Referring still to FIG. 1, the inverter INV3 is sized such that its output rises slower than the power up signal 110 so that it will turn off transistors PS1 and PS2 and turn on transistor NS1 only after the power signal 110 has been safely latched by the inverters INV1 and INV2. In this manner, the transistors PS1 and PS2 cut off any current paths from the VCC input 101 to the ground 102. Since the current paths through the transistor MP4 and the resistor Rpoly have been shut off after the assertion of the power up signal 110, there is no static current in power up circuit 100.

Figure 2:
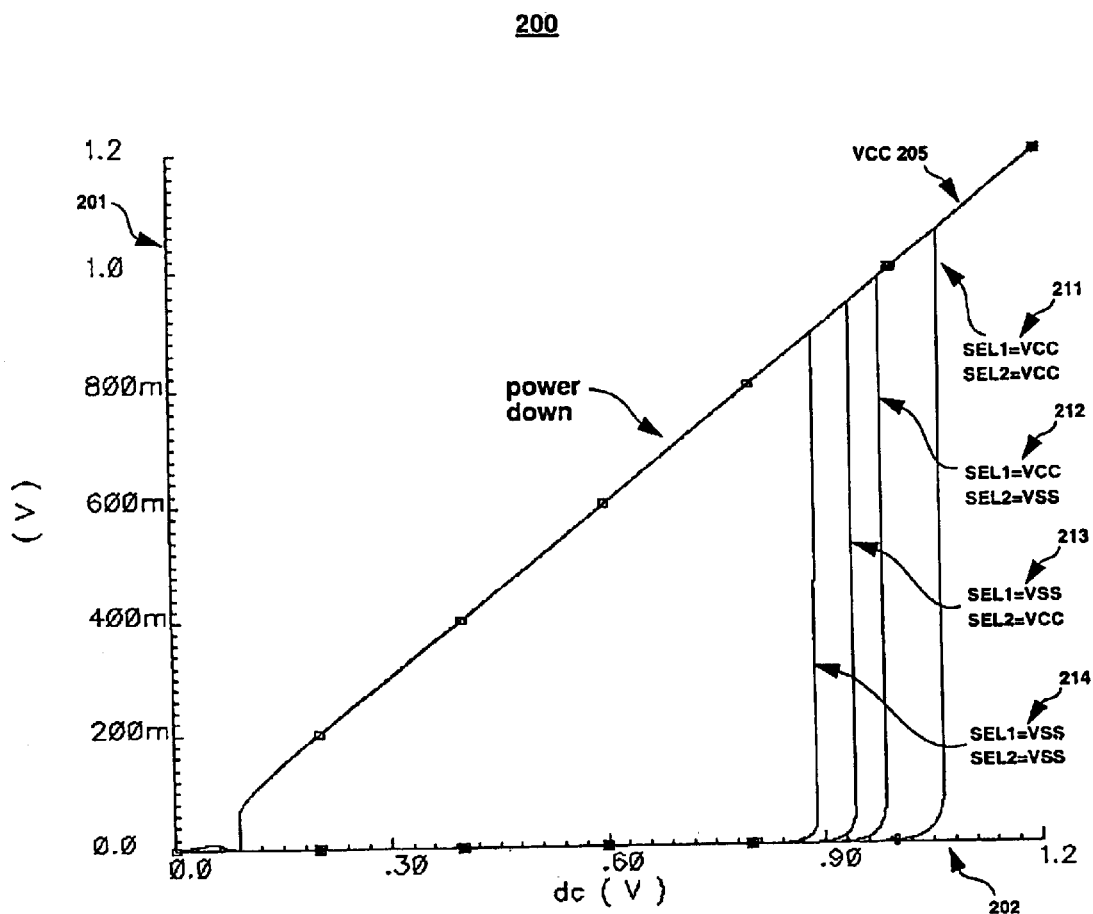
FIG. 2 shows a graph of a power transfer curve produced by a power up circuit in accordance with one embodiment of the present invention.

FIG. 2 shows a graph 200 of a power transfer curve produced by the power up circuit 100 in accordance with one embodiment of the present invention. As depicted in FIG. 2, the vertical axis 201 shows a voltage level of the power up signal 110 and the horizontal axis 202 shows a voltage level of the VCC input 101.

The graph 200 illustrates the transfer curve of the power up signal 110 vs the VCC input 101. Line 205 shows that as the voltage level of VCC increases, different combinations of the select lines SEL1 and SEL2 cause the power up signal to rapidly rise to the voltage level of VCC once the switch on threshold is reached, and follow the voltage level of VCC as it continues to increase. The four combinations of the select lines are depicted as combinations 211–214. Thus, the graph 200 shows that different VCC switching points, or power up signal points, can be obtained by selecting different combinations of SEL1 and SEL2. This can be useful for integrated circuit devices that prefer or require different levels of the start up voltage for VCC.

Figure 3:
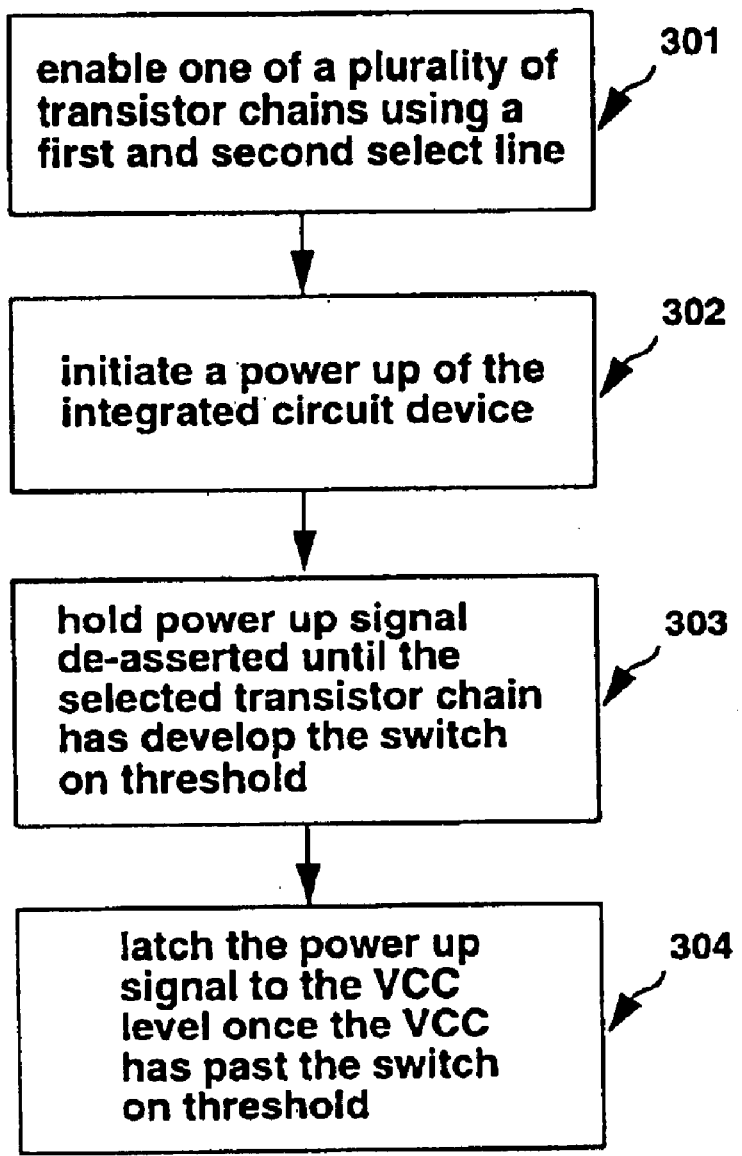
FIG. 3 shows a flowchart of the steps of a power up process in accordance with one embodiment of the present invention.

FIG. 3 shows a flowchart of the steps of a power up process 300 in accordance with one embodiment of the present invention. As depicted in FIG. 3, process 300 shows the operating steps of a power up circuit (e.g., power up circuit 100 of FIG. 1) as power is initially applied to an integrated circuit device and a power up signal (e.g., power up signal 110) is generated therefrom.

Process 300 begins in step 301, where one of a plurality of transistor chains is enabled using the first and second select lines. As described above, depending on the combinations of the select lines SEL1 and SEL2, one of four transistor chains is selected for coupling to VCC. In step 302, a power up of the integrated circuit device is initiated. This can include, for example, turning on the integrated circuit device from an off state. In step 303, the power up signal of the power up circuit is held in a deasserted state until the selected transistor chain has developed the selected switch on threshold voltage. As described above, the power up signal is latched in the deasserted state as the voltage level of VCC rises, and remains latched until the switch on threshold is reached. The current through the resistance provided by the selected transistor chain sets a switch on threshold for latching of the power up signal 110 by the inverters INV1 and INV2. Subsequently, in step 304, a power up signal 110 is latched to the asserted state (e.g., high) once the voltage level of VCC rises past the switch on threshold. As described above, the latch uses a pair of inverters (e.g., the inverters INV1 and INV2) to latch the power up signal to the asserted state such that any drooping of the voltage level of VCC cannot disturb the power up signal 110.

Thus, the embodiments of the present invention are directed towards a power up circuit which maintains a valid power up signal over a range of power supply voltage levels, in comparison to the prior art. The present invention provides a power up circuit than maintains a constant power up signal that can be readily fabricated using modern CMOS VLSI fabrication techniques. In addition, the present invention provides switch on threshold tuning capability.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order best to explain the principles of the invention and its practical application, thereby to enable others skilled in the art best to utilize the invention and various embodiments with various modifications as are suited to the particular use contemplated. It is intended that the scope of the invention be defined by the claims appended hereto and their equivalents.

What is claimed is:

1. A CMOS power up circuit for producing a power up signal for an integrated circuit device, comprising:
   a plurality of transistor chains;
   at least one select line coupled to the transistor chains and configured to enable a selected one of the transistor chains;
   a VCC input coupled to the transistor chains; and
   an output latch for generating a power up signal, the output latch coupled to the transistor chains and to the VCC input, the output latch configured to keep the power up signal deasserted until a voltage from the selected one transistor chain rises past a switch on threshold as VCC rises, whereupon the output latch asserts the power. up signal and maintains the power up signal asserted in the presence of noise on the VCC input.

2. The CMOS power up circuit of claim 1 wherein each of the plurality of transistor chains is configured to provide a respective switch on threshold by providing a respective resistance when enabled by the at least one select line.

3. The CMOS power up circuit of claim 1 wherein the at least one select line is configured to implement an adjustable switch on threshold as the at least one select line selectively enables one of the transistor chains.

4. The CMOS power up circuit of claim 1 wherein the output latch is configured to use feedback to keep the power up signal deasserted and to maintain the power up signal asserted.

5. The CMOS power up circuit of claim 4 wherein the output latch comprises a first inverter and second inverter coupled to implement the feedback.

6. The CMOS power up circuit of claim 5 further comprising:
   a pulldown transistor coupled to the first inverter; and
   a resistor coupled to the first inverter, wherein the resistor causes the output latch to keep the power up signal deasserted until the voltage rises to the switch on threshold and the pulldown transistor causes the output latch to maintain the power up signal asserted as the voltage rises past the switch on threshold.

7. The CMOS power up circuit of claim 6 further comprising a first shut off transistor and a second shut off transistor configured to cut off current through the resistor and the pulldown transistor when the power up signal is asserted to prevent static current flow in the power up circuit.

8. A system for a power up circuit for producing a power up signal for an integrated circuit device, comprising:
   a plurality of long channel transistor chains, wherein each of the long channel transistor chains are configured to provide a respective resistance value;
   first and second select lines coupled to the long channel transistor chains and configured to enable a selected one of the long channel transistor chains;
   a VCC input coupled to the long channel transistor chains; and
   an output latch for generating a power up signal, the output latch coupled to the long channel transistor chains and to the VCC input, the output latch configured to keep the power up signal deasserted until a voltage from the selected one long channel transistor chain rises past a switch on threshold as VCC rises, whereupon the output latch asserts the power up signal and maintains the power up signal asserted in the presence of noise on the VCC input, and wherein each of the plurality of long channel transistor chains is configured to provide a respective switch on threshold by providing a respective resistance when enabled by the first and second select lines.

9. The system of claim 8 wherein the power up circuit is fabricated using a CMOS process.

10. The system of claim 8 wherein an adjustable switch on threshold is implemented by selectively asserting the first and second select lines.

11. The system of claim 8 wherein the output latch is configured to use feedback to keep the power up signal deasserted and to maintain the power up signal asserted.

12. The system of claim 11 wherein the output latch comprises a first inverter and second inverter coupled to implement the feedback.

13. The system of claim 12 further comprising:
   a pulldown transistor coupled to the first inverter; and
   a resistor coupled to the first inverter, wherein the resistor causes the output latch to keep the power up signal deasserted until the voltage rises to the switch on threshold and the pulldown transistor causes the output latch to maintain the power up signal asserted as the voltage rises past the switch on threshold.

14. The system of claim 13 further comprising a first shut off transistor and a second shut off transistor configured to cut off current through the resistor and the pulldown transistor when the power up signal is asserted to prevent static current flow in the power up circuit.

15. A method for producing a power up signal for an integrated circuit device using a CMOS power up circuit, comprising:
   generating a plurality of different resistance values by using a plurality of transistor chains;
   enabling a selected one of the transistor chains by using first and second select lines coupled to the transistor chains; and
   generating a reliable power up signal by using an output latch coupled to the transistor chains and to a VCC input, the output latch configured to keep the power up signal deasserted until a voltage from the selected one transistor chain rises past a switch on threshold as VCC rises, whereupon the output latch asserts the power up signal and maintains the power up signal asserted in the presence of noise on the VCC input.

16. The method of claim 15 further comprising:

generating a respective switch on threshold by providing a respective resistance from a selected one of the plurality of transistor chains when enabled by the first and second select lines.

17. The method of claim 16 further comprising:

implementing an adjustable switch on threshold as the first and second select lines selectively enable one of the transistor chains.

18. The method of claim 17 wherein the output latch is configured to use feedback to keep the power up signal deasserted and to maintain the power up signal asserted.

* * * * *